(12) United States Patent
Pesavento

(10) Patent No.: US 7,580,311 B2
(45) Date of Patent: Aug. 25, 2009

(54) REDUCED AREA HIGH VOLTAGE SWITCH FOR NVM

(75) Inventor: Alberto Pesavento, Seattle, WA (US)

(73) Assignee: Virage Logic Corporation, Fremont, CA (US)

( * ) Notice: Subject to any disclaimer, the term of this patent is extended or adjusted under 35 U.S.C. 154(b) by 195 days.

(21) Appl. No.: 11/513,597

(22) Filed: Aug. 30, 2006

(65) Prior Publication Data

US 2006/0291319 A1      Dec. 28, 2006

Related U.S. Application Data

(63) Continuation-in-part of application No. 10/814,867, filed on Mar. 30, 2004, now Pat. No. 7,145,370.

(60) Provisional application No. 60/719,626, filed on Sep. 21, 2005.

(51) Int. Cl.
      *G11C 5/14*      (2006.01)

(52) U.S. Cl. .................. 365/226; 327/112; 327/217
(58) Field of Classification Search ............. 365/226 O, 365/226; 327/112 X, 217 X, 108, 427, 430, 327/431, 434, 436, 437, 215, 219, 112, 217; 326/83–85, 87
See application file for complete search history.

(56) References Cited

U.S. PATENT DOCUMENTS

| | | | | |
|---|---|---|---|---|
| 5,729,155 A | * | 3/1998 | Kobatake ..................... | 326/68 |
| 5,963,061 A | * | 10/1999 | Briner ......................... | 327/55 |
| 7,388,420 B2 | * | 6/2008 | Diorio et al. ................ | 327/525 |

* cited by examiner

*Primary Examiner*—VanThu Nguyen
(74) *Attorney, Agent, or Firm*—Nixon Peabody LLP; David B. Ritchie

(57) ABSTRACT

In a high voltage switch circuit for programming memory cells, preset devices for precharging the core circuit are eliminated by statically presetting nodes of the switch core circuit through a pair of drive circuits arranged to pull up or down a pair of cascoded transistors in the core circuit.

6 Claims, 6 Drawing Sheets

HV SWITCH CORE CIRCUIT AND
DRIVING CIRCUIT

DEVICE WITH MEMORY

MEMORY AND SUPPORT CIRCUITRY

HV SWITCH CORE CIRCUIT AND DRIVING CIRCUIT

REDUCED AREA HIGH VOLTAGE SWITCH FOR NVM

RELATED APPLICATIONS

This utility patent application claims the benefit of U.S. Provisional Application Ser. No. 60/719,626 filed on Sep. 21, 2005, which is hereby claimed under 35 U.S.C. §119(e). The provisional application is incorporated herein by reference.

This utility patent application is a continuation-in-part (CIP) of U.S. patent application No. 10/814,867, filed Mar. 30, 2004. The benefit of the earlier filing date of the parent application is hereby claimed under 35 U.S.C. §120.

TECHNICAL FIELD

The present invention relates to Non-Volatile Memory (NVM) circuits and devices; and more particularly, to a reduced area high voltage switch circuit to support an NVM.

BACKGROUND

Memory devices are electronic devices arranged to store electrical signals. For example, a basic memory element may be a fuse that can either be open or be closed. Open and closed states of the fuse may be used to designate one bit of information corresponding to a value of 1 or 0. A plurality of memory elements can be combined in various arrangements in order to store multiple bits arranged in words or other combinations. Various electronic circuits including semiconductor devices such as transistors are used as memory elements.

Memory elements may be classified in two main categories: volatile and nonvolatile. Volatile memory loses any data as soon as the system power is turned off. Thus, it requires constant power to remain viable. Most types of random access memory (RAM) fall into this category. Non-volatile memory does not lose its data when the system or device is turned off. An NVM device may be implemented as a MOS transistor that has a source, a drain, an access or a control gate, and a floating gate. It is structurally the same as standard MOSFET except its gate is floating, which is electrically isolated." There are also many structural variations of MOS devices to enhance the operation or reduce the size of NVM devices.

A range of considerations including a purpose of the device, power consumption, size, retention capacity and duration may influence design of non-volatile memory devices. For example, some NVM devices may be categorized as floating gate or charge-trapping from a programming perspective.

Non-volatile memory devices may also be implemented as NVM arrays that include a plurality of NVM cells arranged in rows and columns. In general, single-transistor n-channel NVM cells operate as follows. During an erase operation, electrons are removed from a floating gate of the NVM cell, thereby lowering the threshold voltage of the NVM cell. During a program operation, electrons are inserted into the floating gate of the NVM cell, thereby raising the threshold voltage of the NVM cell. Thus, during program and erase operations, the threshold voltages of selected NVM cells are changed. During a read operation, read voltages are applied to selected NVM cells. In response, read currents flow through these selected NVM cells.

Certain types of nonvolatile memory devices, circuits employing floating-gate devices, high-voltage drivers and other circuits fabricated in logic CMOS require relatively high voltages (e.g., 10 volts in a 3.3 volt CMOS process). For example, in nonvolatile memory devices high voltages are often used to by circuits that program and erase information stored on the floating gates, and on-chip charge pumps are generally used to generate these high voltages. In all these circuits, switches are required to selectively apply the high voltages to specific circuit elements.

Tolerating a high-voltage supply, generating intermediate voltages, as well as generating high-voltage drive signals from low-voltage logic-gate-level signals while minimizing power consumption, are substantial design parameters for switch circuits adapted to program memory devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments are directed to statically presetting a pair of intermediate nodes at the drain terminals of a pair of latching transistors of a high voltage switch circuit.

According to some embodiments, a pair of nodes at the source terminals of a pair of transistors cascoded to the latching transistors are driven by a reset signal directly manipulating output voltages and eliminating a need for larger size preset transistors.

This and other features and advantages of the invention will be better understood in view of the Detailed Description and the Drawings, in which:

BRIEF DESCRIPTION OF THE DRAWINGS

Non-limiting and non-exhaustive embodiments are described with reference to the following drawings.

DETAILED DESCRIPTION

Figure 1:
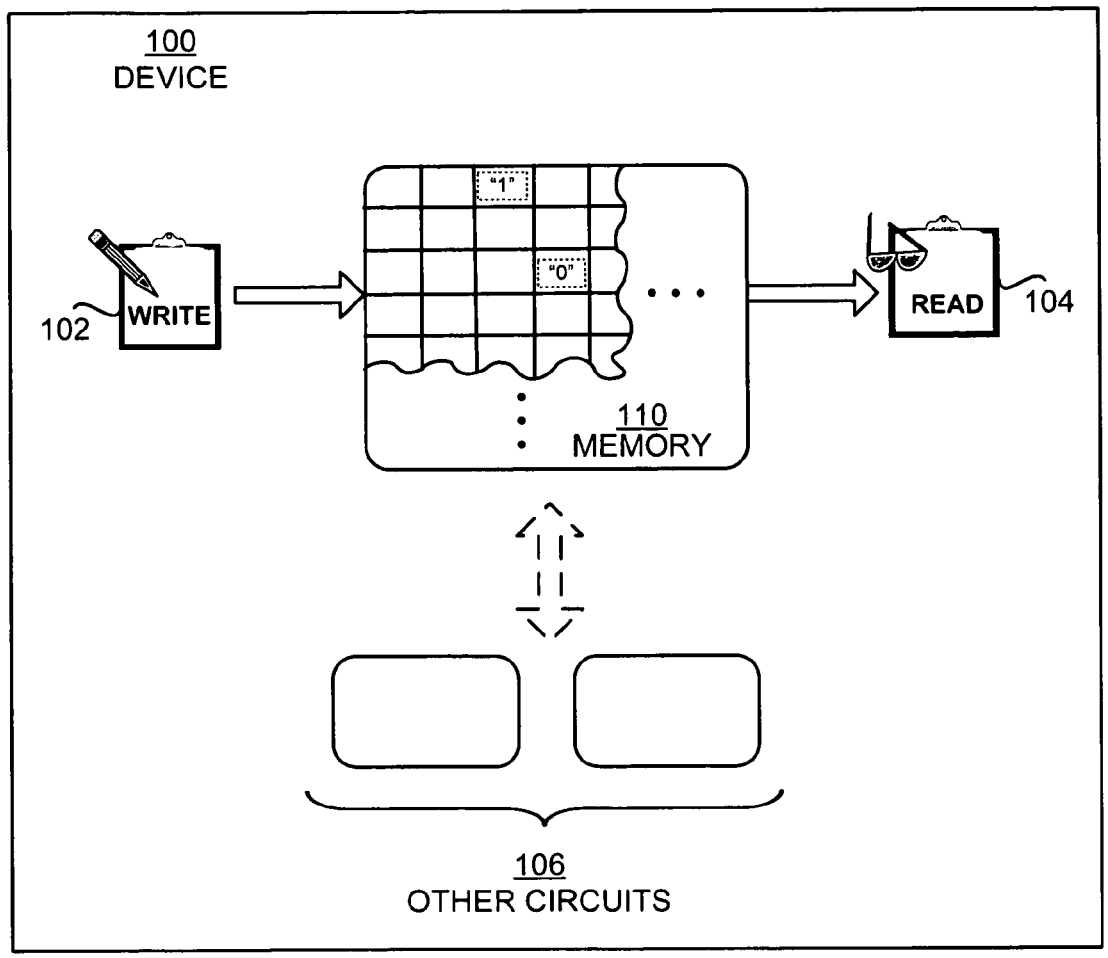
FIG. 1 is a diagram of an example electronic device with a memory block providing information to other circuitry within the electronic device.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed subject matter.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity.

FIG. 1 is a diagram of an example electronic device with a memory block providing information to other circuitry within the electronic device. Device 100 includes memory 110 that is adapted to interact with other circuits 106. Individual cells of memory 110 are adapted to store information as a result of "write" operation 102 and provide the stored information as a result of "read" operation 104. The information is stored even during a power-off state of device 100.

"Read" operation 104, which provides the stored information to one or more of the other circuits 106, may occur during a transition from the power-off state to a power-on state for some parts of memory 110. For other parts of memory 110, "read" operation 104 may occur during the power-on state upon being addressed by another circuit (e.g. a controller).

As a result, different circuits of device 100 may receive data for their operation at different states of powering the device. For example, an oscillator circuit may be provided calibration data during the transition from the power-off state from one part of memory 110, while a digital signal processor circuit may be provided programming data after the transition.

The information stored in memory 110 may include analog, digital or other types of data. For example, different parts of memory 110 may provide logic bits, ON/OFF states, latched outputs for trimming analog circuits, and the like. Memory 110 may include a number of NVM bits, which are defined as NVM bits that contain a single storage element.

Figure 2:
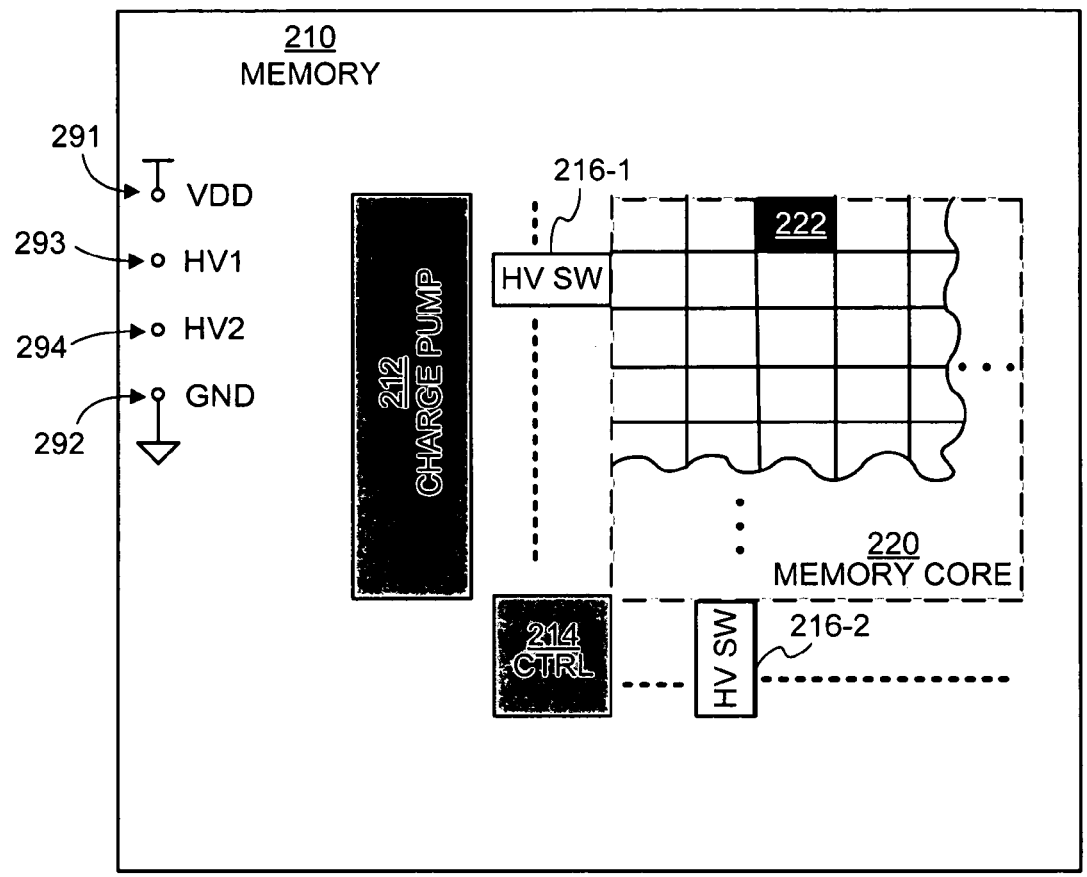
FIG. 2 is a diagram of the memory block of FIG. 1 with its memory core circuit and support circuitry.

FIG. 2 is a diagram of the memory block of FIG. 1 with its memory core circuit and support circuitry. In a basic configuration, memory block 210 includes memory core circuit 220, and support circuitry. Support circuitry includes charge pump 212, high voltage (HV) switches 216-1 through 216-N (represented in the figure by HV switches 216-1 and 216-2), and control circuitry 214. Memory block 210 may include additional components. This basic configuration is provided to highlight the relationship between relevant components of a memory device.

Memory core circuit 220 may include an assembly of memory cells such as a memory array. Furthermore, cells within memory core circuit 220 may be grouped based on their type or function. According to one embodiment, memory core circuit 220 may be an NVM array comprising memory cells (cells with a single storage component).

The cells of memory core circuit 220, such as cell 222, may be configured in many ways. For example, each cell may comprise a logic circuit formed by transistor devices. In a basic configuration, each cell may include a FET device with a floating gate terminal. In other configurations, more complex logic circuits such as NOR, NAND, and the like, may also be implemented.

The FET(s) of cell 222 may include a Metal-Oxide Field Effect Transistor (MOSFET), a FinFET, a Gallium-Arsenide FET (GaAs FET), or a Metal-Semiconductor Field Effect Transistor (MESFET). The cell may also include a Flash memory cell, a Silicon-Oxide-Nitride-Oxide-Silicon (SONOS) circuit, a nanocrystal flash device, and the like. In the basic example of single transistor device with floating gate, the information (bit) may be stored in cell 222 by increasing or decreasing an amount of charge on the floating gate.

As mentioned above, a non-volatile memory cell may be constructed using a floating-gate pFET readout transistor having its source tied to a power source and its drain providing a current, which can be sensed to determine the state of the cell. The gate of the pFET readout transistor provides for charge storage, which can be used to represent information such as binary bits. A control capacitor structure having its first terminal coupled to a first voltage source and its second terminal coupled to the floating gate and a tunneling capacitor structure having its first terminal coupled to a second voltage source and its second terminal coupled to the floating gate may be utilized in each embodiment.

The control capacitor structure is fabricated so that it has much more capacitance than does the tunneling capacitor structure (and assorted stray capacitance between the floating gate and various other nodes of the cell). Manipulation of the voltages applied to the first voltage source and second voltage source controls an electric field across the capacitor structure and pFET dielectrics and thus Fowler-Nordheim tunneling of electrons onto and off of the floating gate, thus controlling the charge on the floating gate and the information value stored thereon.

High voltage switches 216-1 and 216-2 are examples of a series of high voltage switches that are arranged to provide the first and the second voltages for programming and erasing of the NVM cells.

Control circuitry 214 is arranged to program and address individual cells of the NVM sub-circuits to output their data by managing high voltage switches 216-1, 216-2, and the like.

NVM charge pump 212 is an electronic circuit that uses capacitors as energy storage elements to convert low voltages into higher voltage outputs. Charge pump circuits are typically capable of high efficiencies, sometimes as high as 90-95%.

NVM charge pump 212 may use switches to control a connection of voltages to the capacitor. For example, to generate a higher voltage, a first stage may involve the capacitor being connected across a voltage and charged up. In a second stage, the capacitor is disconnected from the original charging voltage and reconnected with its negative terminal to the original positive charging voltage. Because the capacitor retains the voltage across it (ignoring leakage effects) the positive terminal voltage is added to the original, effectively doubling the voltage. This higher voltage output may then be smoothed by the use of another capacitor.

Memory block 210 also includes node 291 for providing high supply voltage (VDD) and node 292 for providing low supply voltage (GND) to the circuits in the memory block. Nodes 293 and 294 are arranged to provide high voltages HV1 and HV2 to the HV voltage switches as described in more detail below.

Memory block 210 may include additional circuitry. For example, a reading circuitry may be configured to provide the stored information from selected cells of memory core circuit 220 to other circuits. The reading circuitry may receive selection signal(s) from another circuit for selecting a cell before reading its content. In the above example, a basic reading circuit may include a transistor circuit that provides an output voltage or current based on a charge status of its gate terminal.

In other embodiments, the reading circuitry may include transistor pairs arranged to operate as a NOR circuit or as a NAND circuit. Output voltage Vo in such embodiments corresponds to "0" or "1" depending on the charge levels of the floating gates as programmed by the input (tunneling) voltages. Other logic circuits such as XOR, XNOR, and the like, may be implemented without departing from a scope and spirit of the invention.

Figure 3:
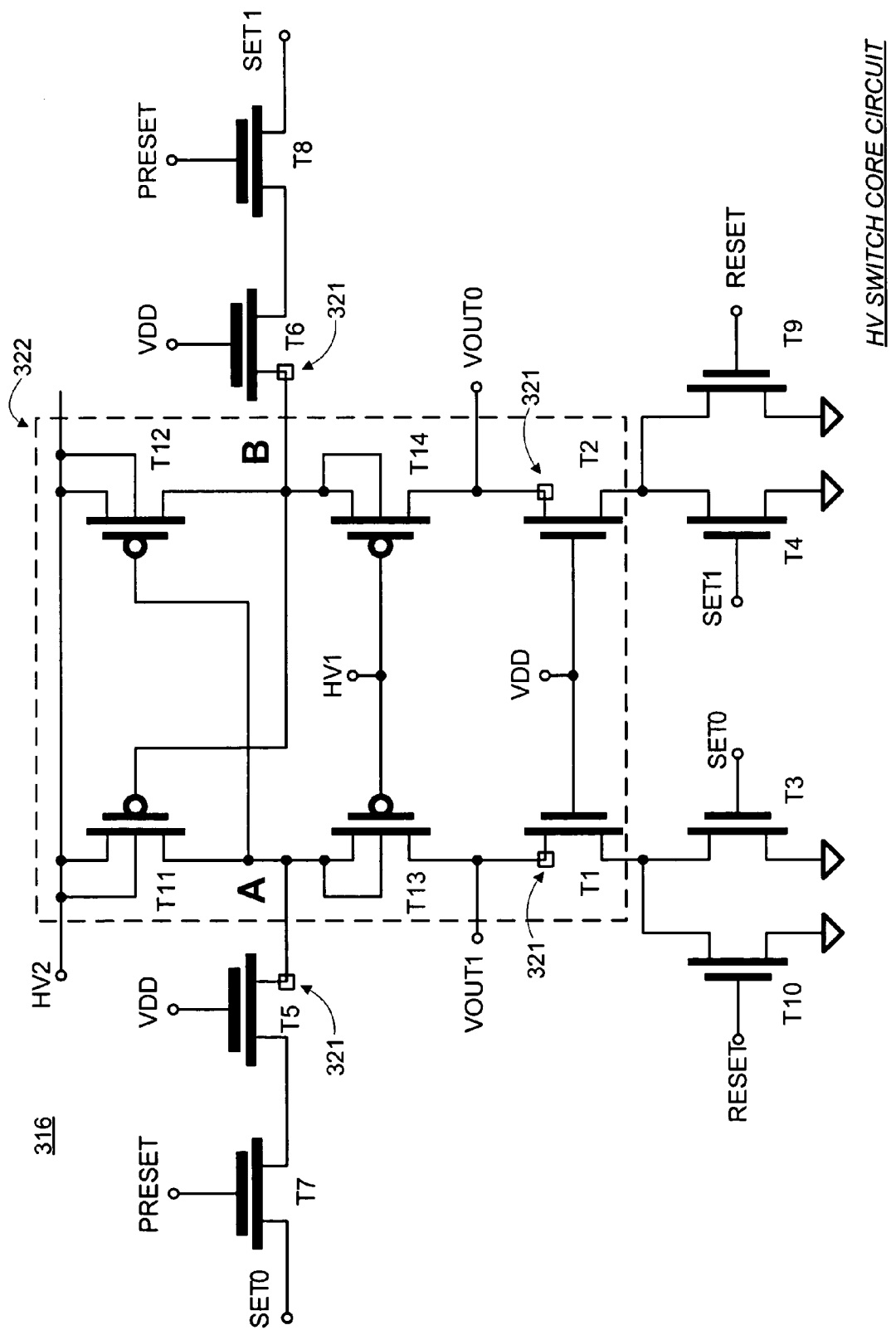
FIG. 3 is a schematic diagram of an example High Voltage (HV) switch circuit that may be used in the memory block of FIG. 2.

FIG. 3 is a schematic diagram of an example High Voltage (HV) switch circuit that may be used in the memory block of FIG. 2.

HV switch core circuit 316 uses a PRESET input along with the SET and RESET inputs at nFETs T7 and T8 to "preset" or "precharge" one of the drain nodes (A or B) of the latching pFET pair T11, T12 before the high voltage supply HV2 is ramped high. Isolation from the high-voltages present in the switch circuit is provided by series connected (cascoded) high-voltage nFETs T5 and T6, respectively, which are left in the on state by applying VDD to their gates. Presetting one of intermediate nodes A or B prevents both T11 and T12 from turning on simultaneously, due to capacitive voltage division from their gate nodes to ground, when ramping the high voltage supply. In many cases, the high voltage may be generated by a high-impedance power supply which cannot handle the resulting current draw that occurs when both T11 and T12 are conducting simultaneously. In one example implementation, the high voltage HV2 may be about 10V, the intermediate high voltage HV1 may be about 6V, and VDD may be about 3.3V. The circuit consumes zero static power in either one of the on state or the off state.

When VOUT1 is low, pFET T13 ensures that none of the series pFETs T11 and T13 have excessive drain-to-source voltage across them. Similarly, when VOUT0 is low, pFET T14 ensures that none of the series pFETs T12 and T14 have excessive drain-to-source voltage across them. Logic signals SET0 and RESET provided to transistor pair T3, T10 and SET1 and RESET provided to transistor pair T4, T9, are used to transition the circuit between different operational phases.

Figure 4:
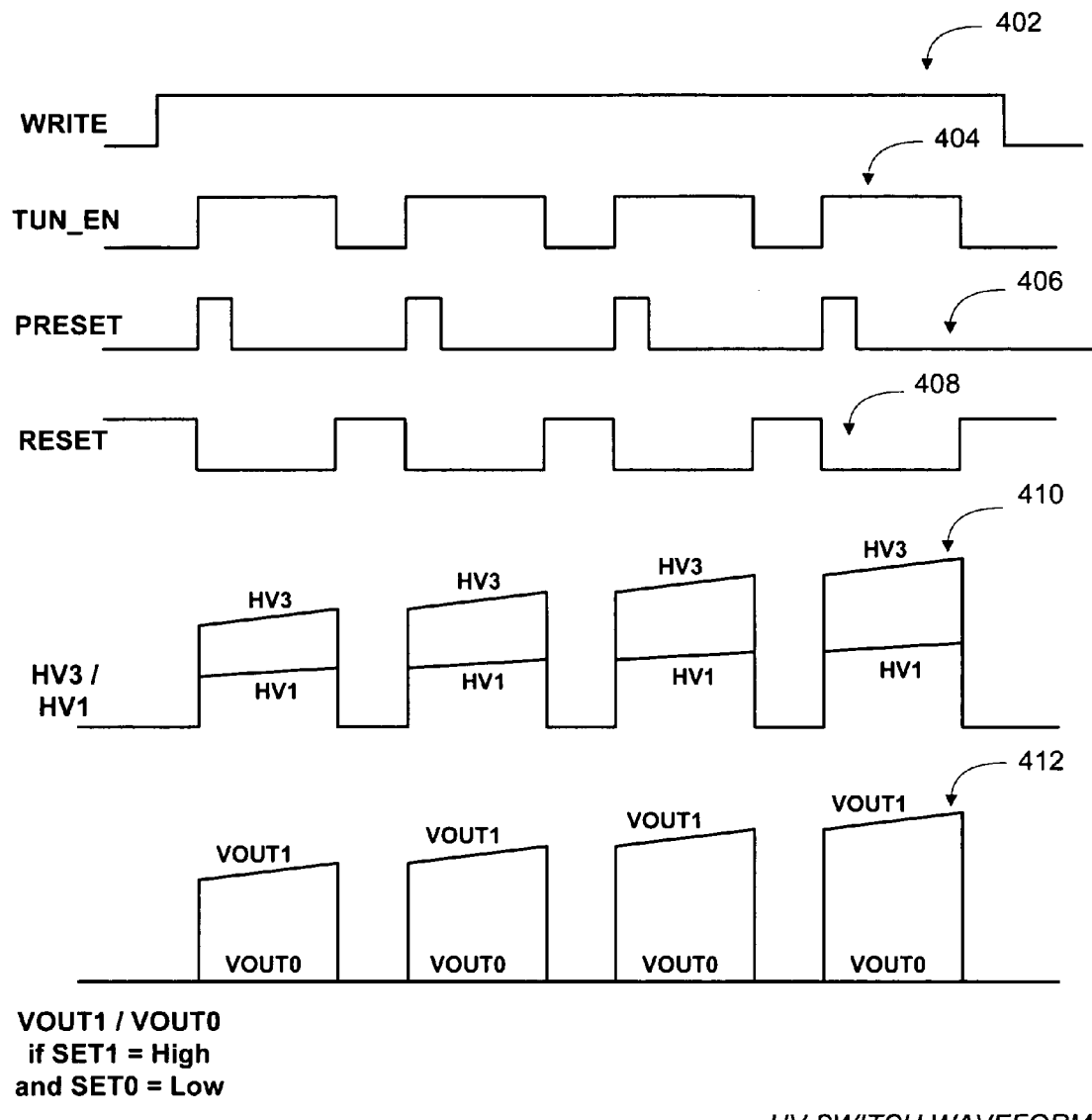
FIG. 4 illustrates various waveforms of the example HV switch circuit of FIG. 3.

FIG. 4 illustrates various waveforms of the example HV switch circuit of FIG. 3.

In FIG. 4, first illustrated waveform is WRITE signal 402, which enables the memory circuit to be programmed activating the HV switch circuit for the programming.

TUN_EN 404 and RESET 408 are complementary logic signals transitioning the HV switch circuit. PRESET signal 406 is a trigger signal for precharging the nodes A or B through preset transistors as described above. PRESET 406 typically follows a transition of the TUN_EN signal from a low value to a high value.

Waveform 410 illustrates the ramping of high voltages HV1 and HV2 in relation to each other. The high voltages begin at a predetermined initial value as soon as PRESET 406 activates the preset transistors thereby precharging the nodes A or B. The high voltages then increase until the RESET signal transitions to a high value pulling the preset nodes down and dropping the output to substantially zero.

Next waveform 412 illustrates VOUT1 in relation to VOUT0 when the above described transitions are applied to the circuit. In the HV switch circuit of FIG. 3, VOUT1 follows a pattern of HV1 and HV2 while VOUT0 is substantially zero when SET1 has a high value and SET0 has a low value. By alternating SET1 and SET0, the opposite effect can be obtained switching the output voltages.

Figure 5:
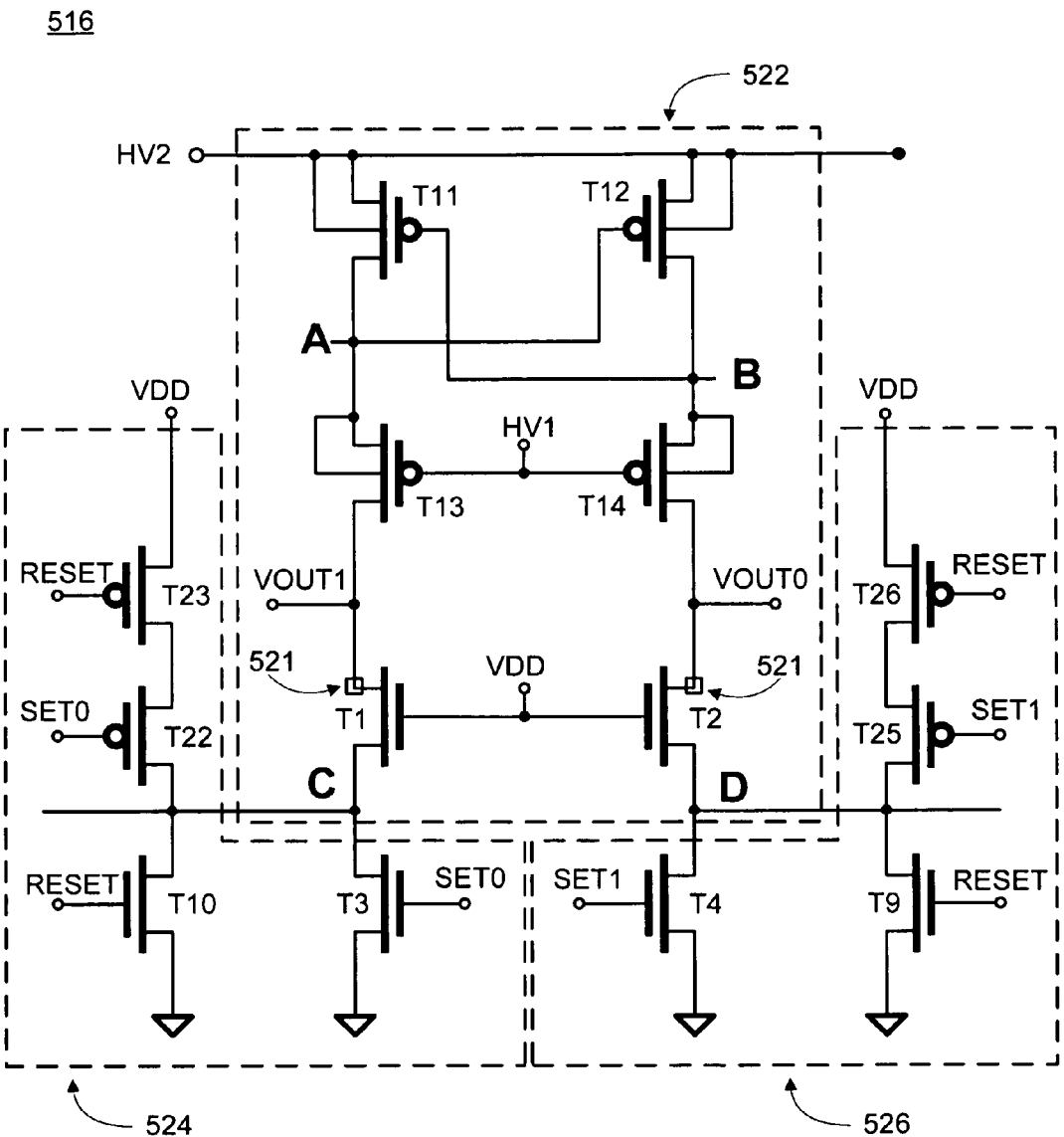
FIG. 5 is a schematic diagram of an example High Voltage (HV) switch circuit according to embodiments that may be used in the memory block of FIG. 2.

FIG. 5 is a schematic diagram of an example High Voltage (HV) switch circuit according to embodiments that may be used in the memory block of FIG. 2.

HV switch core circuit 522 includes the same components as core circuit 322 of FIG. 3, such as cascaded pFET pairs T11, T13 and T12, T14, that are arranged to operate in a similar manner.

Differently from HV switch circuitry of FIG. 3, however, the nodes A and B of core circuit 522 are not preset or precharged by a pair of preset transistors and supply voltage devices. These are typically larger transistors consuming valuable space and power in an integrated circuit. According to the illustrated embodiment, the nodes A and B are statically preset via devices T1, T13 and T2, T14 respectively by increasing the voltage level at either one of the nodes C and D. Thus, output voltages VOUT0 and VOUT1 are manipulated at nodes C and D providing a more direct control over the output voltages.

The nodes C and D are driven by nFET devices T10, T3 and T4, T9 respectively. In addition, the driving circuits includes cascoded transistor pairs T22, T23 and T25, T26 to preset the nodes C and D, respectively, based on the logic signals SET0, SET1, and RESET. In contrast to the HV switch circuit of FIG. 3, the additional driving transistors of driving circuits 524 and 526 may be regular size transistors saving valuable space and power. In some implementations, a size of each of the additional driving transistors may be as small as half the size of each of the HV preset transistors.

Furthermore, by presetting the nodes A and B statically instead of dynamically, a timing consideration associated with the circuit may also be simplified. By having fewer transistors coupled to the HV supply, a temperature performance of the circuit may also be enhanced.

An HV switch circuit according to embodiments may include FET's of different types such as nFETs and pFET that are interchanged. Accordingly, the circuit is responsive to a logic level signal such as RESET or to the inverse or complement of the same signal in order to perform the same function. Moreover, driving circuits 524 and 526 are configured to pull nodes C or D up and down. Hence, other implementations of the driving circuits such as Flip Flops may be used without departing from a scope and spirit of the described embodiments.

Those of ordinary skill in the art will realize that CMOS silicon-on-sapphire (SOS) and silicon-on-insulator (SOI) technologies may also be used to fabricate the high-voltage switches as contemplated herein. Both of these technologies use insulating substrate materials for isolating individual devices. In these approaches, an insulating material, typically silicon dioxide, is placed over the substrate material (either sapphire in SOS or silicon in SOI, and potentially other materials as will be apparent to those of ordinary skill in the art). A thin silicon layer is then placed on top of the oxide. Transistors are then fabricated in a similar fashion to bulk CMOS processes. Floating-gate devices may be used in these processes as well.

Embodiments are not limited to the described example circuits. Other embodiments may be implemented using the principles described herein. For example, it should be noted that while the embodiments may be implemented in a single-well single-poly process and can operate with various logic voltage levels from less than 1 Volt to greater than 10 Volts, the invention is not so limited and can be implemented in processes that support multiple polysilicon layers, multiple wells, and/or higher voltage devices. Furthermore, the concept of a high-voltage nFET as used herein is intended to encompass not only n-well devices, but also NLDD (N-type Lightly Doped Drain) devices and other lightly doped, or isolated structures that increase the reliable drain-to-gate and drain-to-source voltages of the device so that it, in effect, behaves like an LDMOS or DEMOS nFET in this respect. Finally, those of ordinary skill in the art will recognize that MOS gates may be fabricated in a number of ways other than by heavily doped polycrystalline silicon. For example, they may be fabricated of metal or other conductors.

Figure 6:
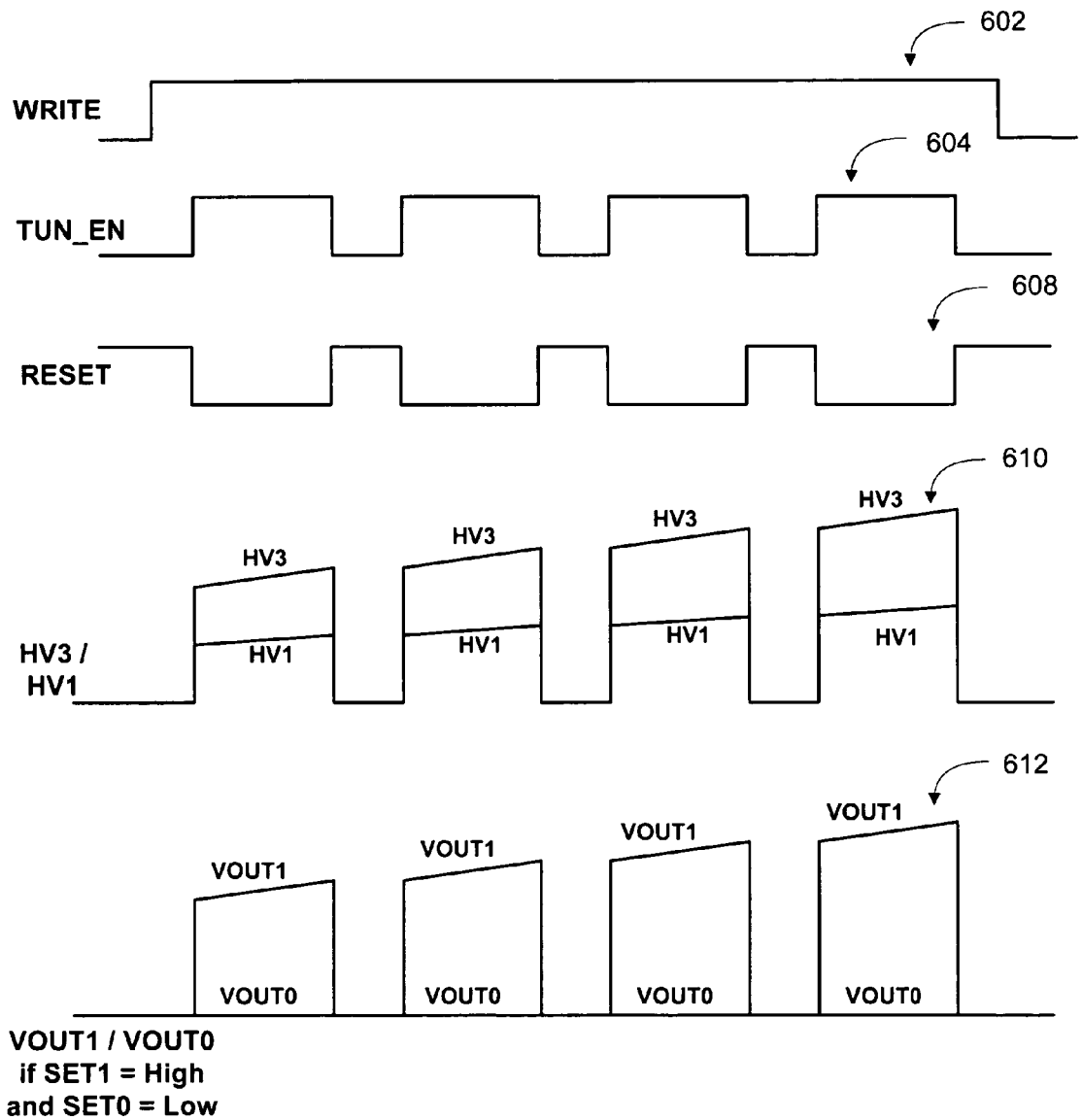
FIG. 6 illustrates various waveforms of the HV switch circuit of FIG. 5 according to embodiments.

FIG. 6 illustrates various waveforms of the HV switch circuit of FIG. 5 according to embodiments.

In FIG. 6, control signals applied to the circuit, WRITE signal 602, RESET signal 608, and TUN_EN 604, are substantially the same as in FIG. 4. Differently from FIG. 4 (and from the HV switch circuit of FIG. 3), a preset signal is no longer needed in the HV switch circuit of FIG. 5. Therefore, no preset signal is shown in FIG. 6.

High voltages HV1 and HV2 illustrated by waveform 610 in relation to each other follow a similar pattern to the waveforms of FIG. 4, but they start when RESET signal 608 transitions from a high value to a low value, ramp up, and drop to substantially zero when the RESET signal 608 transitions back to a high value.

Output voltages VOUT1 and VOUT0, as illustrated by waveform 612, have the same pattern following the high voltages with VOUT0 being substantially zero when SET1 has a high value and SET0 has a low value. The output voltages can be switched by alternating SET1 and SET0.

This detailed description is presented largely in terms of diagrams, schematics, and layout diagrams. Indeed, such descriptions and representations are the type of convenient labels used by those skilled in integrated circuit design arts to effectively convey the substance of their work to others skilled in the art. A person skilled in the art of integrated circuit design may use these descriptions to readily generate specific instructions for implementing devices according to the embodiments.

The electrical circuit(s) described in this document can be manufactured in any number of ways, as will be appreciated by the persons skilled in the art. One such way is as integrated circuit(s), as described below.

Schematic-type inputs can be provided for the purpose of preparing one or more layouts. These inputs can include as little as a schematic of a circuit, to more including relative sizes of circuit components and the like, as will be appreciated by a person skilled in the art for such inputs. These inputs can be provided in any suitable way, such as merely in writing, or electronically, as computer files and the like. Some of these computer files can be prepared with the assistance of suitable design tools. Such tools often include instrumentalities for simulating circuit behaviors and the like.

These inputs can be provided to a person skilled in the art of preparing layouts. This, whether the person is within the same company, or another company, such as under a contract.

A layout can be prepared that embodies the schematic-type inputs by the person skilled in the art. The layout is itself preferably prepared as a computer file. It may be additionally checked for errors, modified as needed, and so on.

In the above, computer files can be made from portions of computer files. For example, suitable individual designs can be assembled for the electrical components and circuits indicated in the schematic-type inputs. The individual designs can be generated anew, or selected from existing libraries. In the layout phase, the assembled designs can be arranged to interoperate, so as to implement as integrated circuit(s) the electrical circuit(s) of the provided schematic-type inputs. These computer files can be stored in storage media, such as memories, whether portable or not, and the like.

Then a special type of computer file can be synthesized from the prepared layout, in a manner that incorporates the prepared layout, which has the embodied schematic-type inputs. Such files are known in the industry as IC chip design files or tapeout files, and express instructions for machinery as to how to process a semiconductor wafer, so as to generate an integrated circuit that is arranged as in the incorporated layout.

The synthesized tapeout file is then transferred to a semiconductor manufacturing plant, which is also known as a foundry, and so on. Transferring can be by any suitable means, such as over an electronic network. Or a tapeout file can be recorded in a storage medium, which in turn is physically shipped to the mask manufacturer.

The received tapeout file is then used by mask making machinery as instructions for processing a semiconductor wafer. The wafer, as thus processed, now has one or more integrated circuits, each made according to the layout incorporated in the tapeout file. If more than one, then the wafer can be diced to separate them, and so on.

In this description, numerous details have been set forth in order to provide a thorough understanding. In other instances, well-known features have not been described in detail in order to not obscure unnecessarily the description.

A person skilled in the art will be able to practice the embodiments in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A memory circuit, comprising:
a supply node, a ground node, and a first high voltage (HV) node distinct from the supply node;
at least one memory cell adapted to store data, the memory cell readable by coupling with at least the supply node and the ground node; and
an HV circuit interposed between the first HV node and the at least one memory cell, the HV circuit comprising:
a first and a second Field Effect Transistor (FET), each having a gate and a first and a second terminal, each respective first terminal coupled to the first HV node, the gate of the first FET coupled with the second terminal of the second FET at a first reference node, and the gate of the second FET coupled with the second terminal of the first FET at a second reference node;
a third FET and a fourth FET, each having a gate and a first and a second terminal, each of their gates coupled to a second HV node, the first terminal of the third FET coupled to the first reference node, the first terminal of the fourth FET coupled to the second reference node, the second terminal of the third FET configured to provide a first output voltage to the memory cell, the second terminal of the fourth FET configured to provide a second output voltage to the memory cell; and
a fifth FET and a sixth FET, each having a gate and two terminals, each of their gates coupled to the supply voltage, the first terminal of the fifth FET coupled to the second terminal of the third FET, the first terminal of the sixth FET coupled to the second terminal of the fourth FET, the second terminal of the fifth FET adapted to be driven by a first driving circuit, the second terminal of the sixth FET adapted to be driven by a second driving circuit, and in which the first output voltage and the second output voltage are provided by thus driving the second terminals of the fifth FET and the sixth FET, wherein the first driving circuit comprises:

a first driving FET having a gate and two terminals, its gate adapted to receive a SET signal, its first terminal coupled with the second terminal of the fifth FET;

a second driving FET having a gate and two terminals, its gate adapted to receive the SET signal, its first terminal coupled with the first terminal of the first driving FET, and its second terminal coupled to the ground node;

a first reset FET having a gate and two terminals, its gate adapted to receive a RESET signal complementary to the SET signal, its first terminal coupled with the first terminal of the first driving FET, and its second terminal coupled to the ground node; and a second reset FET having a gate and two terminals, its gate adapted to receive the RESET signal, its first terminal coupled with the second terminal of the first driving FET, and its second terminal coupled to one of the supply node and the first (HV) node.

2. The circuit of claim 1, in which
the first and the second driving FETs are pFETs.

3. The circuit of claim 1, in which
the first and the second driving FETs are nFETs.

4. A method for operating a memory structure, comprising:

storing data in at least one memory cell adapted to store data, the memory cell readable by coupling with at least a supply node and a ground node;

obtaining a first output voltage and a second output voltage based on a first high voltage (HV) and a second HV by an HV circuit interposed between a first HV node, a second HV node, and the at least one memory cell, the HV circuit comprising:

a first and a second Field Effect Transistor (FET), each having a gate and a first and a second terminal, each respective first terminal coupled to the first HV node, the gate of the first FET coupled with the second terminal of the second FET at a first reference node, and the gate of the second FET coupled with the second terminal of the first FET at a second reference node;

a third FET and a fourth FET, each having a gate and a first and a second terminal, each of their gates coupled to the second HV node, the first terminal of the third FET coupled to the first reference node, the first terminal of the fourth FET coupled to the second reference node, the second terminal of the third FET configured to provide the first output voltage to the memory cell, the second terminal of the fourth FET configured to provide the second output voltage to the memory cell; and a fifth FET and a sixth FET, each having a gate and two terminals, each of their gates coupled to the supply voltage, the first terminal of the fifth FET coupled to the second terminal of the third FET, the first terminal of the sixth FET coupled to the second terminal of the fourth FET, the second terminal of the fifth FET adapted to be driven by a first driving circuit, the second terminal of the sixth FET adapted to be driven by a second driving circuit;

providing the first and the second output voltage by thus driving the second terminals of the fifth FET and the sixth FET;

providing the first and the second output voltage to the at least one memory cell for programming and erasing, and driving the second terminal of the fifth FET by the first driving circuit which comprises:

a first driving FET having a gate and two terminals, its gate adapted to receive a SET signal, its first terminal coupled with the second terminal of the fifth FET;

a second driving FET having a gate and two terminals, its gate adapted to receive the SET signal, its first terminal coupled with the first terminal of the first driving FET, and its second terminal coupled to the ground node;

a first reset FET having a gate and two terminals, its gate adapted to receive a RESET signal complementary to the SET signal, its first terminal coupled with the first terminal of the first driving FET, and its second terminal coupled to the ground node; and a second reset FET having a gate and two terminals, its gate adapted to receive the RESET signal, its first terminal coupled with the second terminal of the first driving FET, and its second terminal coupled to one of the supply node and the first HV node.

5. The method of claim 4, in which
the first and the second driving FETs are pFETs.

6. The method of claim 4, in which
the first and the second driving FETs are nFETs.

* * * * *